Aug. 2, 1960 J. L. ANDERSON 2,947,880

TRANSISTOR SATURATION CONTROL

Filed Nov. 5, 1956

*INVENTOR.*
JOHN L. ANDERSON

*BY* Alvin J. Riddles
AGENT 2,947,880

TRANSISTOR SATURATION CONTROL

John L. Anderson, Poughkeepsie, N.Y., assignor to International Business Machines Corporation, New York, N.Y., a corporation of New York Filed Nov. 5, 1956, Ser. No. 620,526

4 Claims. (Cl. 307—88.5)

This invention relates to a phenomenon known as current saturation in transistor circuits and in particular to a means for controlling the transistor circuit to prevent such saturation.

In the design and development of transistor circuits wherein high output power is desired, it has frequently been the practice in the art to operate the transistor in such circuits at a point beyond the linear portion of the output characteristic. Under these conditions non-linearity of performance and turn-off delay are encountered. The condition resulting from the operation beyond the linear region of the output characteristic of a transistor is known as saturation.

The phenomenon known as saturation takes place when the number of carriers present in the base region of a transistor becomes greater than the number of carriers that can pass through the collector junction. In a circuit saturation is indicated by the fact that the potential at the collector connection approaches more nearly the potential of the emitter connection than does that of the base. In such a condition, the presence of the excess number of carriers in the base region of the transistor produces a delay in turn off time of the transistor. This delay may be as much as the carrier lifetime of these carriers. Thus, it can be seen in high frequency applications, as the frequency goes up, this time delay may become an appreciable fraction of the period of the signal being handled by the circuit.

The circuit of this invention permits normal operation to a point just short of saturation and, when the desired point is reached, provides a source of potential at the base of the transistor equal or slightly more positive than the collector potential thereby establishing equilibrium and stabilizing operation at that point.

The primary object of this invention is to provide a transistor circuit having a saturation control.

Another object of this invention is to provide a transistor circuit wherein the potential of the collector is prevented from more closely approaching that of the emitter than the base potential.

Still another object of this invention is to provide a transistor control circuit which automatically controls the current gain of the transistor with respect to the current passing through the transistor.

Other objects of the invention will be pointed out in the following description and claims and illustrated in the accompanying drawings, which disclose, by way of example, the principle of the invention and the best mode, which has been contemplated, of applying that principle.

Figure 1:
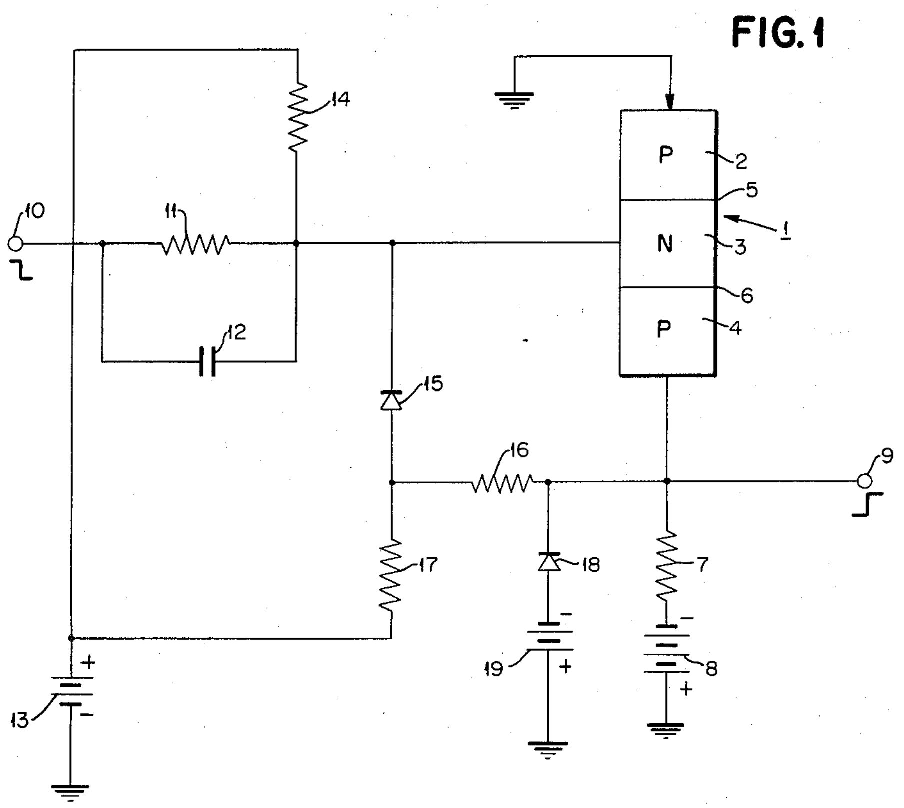
Figure 1 is an embodiment of a transistor inverter circuit illustrating the control principle of this invention.

Referring now to Figure 1 a transistor inverter circuit is shown having a transistor 1 illustrated as a PNP junction transistor, having an emitter 2, a base 3 and a collector 4 separated by junctions 5 and 6 respectively. The emitter 2 is connected to reference potential or ground. The collector 4 is connected through a suitable load impedance shown as resistor 7 to a source of negative potential shown as battery 8. The positive terminal of battery 8 is connected to reference potential. An output terminal 9 is provided and connected to the collector 4 of transistor 1 for signal transfer purposes well known in the art. An input terminal 10 is provided and connected through a decoupling resistor 11 and pulse shaping capacitor 12 combination to introduce signals to the base 3 of transistor 1. The base 3 of transistor 1 is connected to a positive potential such as a battery 13 through resistor 14. A saturation control circuit is provided comprising an asymmetric impedance 15, which is illustrated as a diode, a resistor 16 and a resistor 17 wherein the cathode of the asymmetric impedance 15 is connected to the base 3 of the transistor 1 and the anode thereof is connected through resistor 17 to a source of positive potential such as battery 13, resistor 16 is connected between the anode of impedance 15 and the collector 4 of transistor 1. A diode 18 is connected to a source of negative potential shown as battery 19 to establish a definite "off potential" level at terminal 9.

In operation, the circuit of Figure 1 serves as a conventional inverter circuit of the type disclosed in copending application, serial number 459,322, filed September 30, 1954, Patent No. 2,891,172 issued June 16, 1959, and assigned to the assignee of this application.

In such a circuit the potential of the output terminal 9 in the no signal condition approaches the potential of battery 8 and when an input signal is impressed on the base 3, current flows through the transistor 1 and an inverted, amplified, reproduction of the input signal appears at terminal 9. In the no signal condition, in the embodiment illustrated in Figure 1 the transistor 1 presents a high impedance to current flow therethrough by virtue of the fact that the base 3 is held at positive potential by being connected through resistor 14 to battery 13, thereby reverse biasing junction 5. Under these conditions the potential at terminal 9 would approach the potential level of battery 8 but is established at the potential level of battery 19. When an input signal is applied to terminal 10 the potential at the base 3 drops to a value sufficient to cause the base 3 to become negative with respect to the emitter 2. The reverse bias on junction 5 is then overcome permitting current flow through transistor 1 so that the potential drop across resistor 7, as the current therethrough increases, causes the potential level at the collector 4, and, consequently, at the output terminal 9, to rise.

Transistor 1 is a transistor with a high base to collector current gain, referred to in the art as $\alpha'$. When the input signal applied to terminal 10 overcomes the reverse bias on the emitter, this type of transistor conducts very heavily causing a rapid change in the potential of collector 4 in the direction of the emitter 2 to a value that may exceed the potential of the base 3. This may be further seen from the fact that in the conducting condition the impedance from emitter 2 to collector 4 of transistor 1 is for all practical purposes negligible in respect to the other parameters in the current path from reference potential at the emitter 2 to the negative potential of battery 8, so that the potential of collector 4 may approach reference potential or ground as illustrated. The base 3, on the other hand, due to the magnitude of a signal applied at input terminal 10 may approach more closely the value of this signal and assume a potential farther from the emitter 2 than is that of collector 4. When this takes place a greater quantity of minority carriers are injected into the base 3 by the emitter junction 5 than can be handled by the collector junction 6. The excess of these carriers when the input signal applied to terminal 10 returns to normal, affects the back resistance of the collector junction 6 and prevents the potential at the output terminal 9 from returning to normal immediately.

In order to prevent this situation, the control circuit of this invention provides a source of potential opposite to the input signal potential and means for applying it to the base 3 when the collector potential level reaches a desired value. This is accomplished through asymmetric impedance 15 and resistor 17 connected in series between the base 3 and a source of positive potential such as battery 13 and the anode of the asymmetric impedance 15 being connected through a resistor 16 to the collector 4 of transistor 1. Under the conditions as the current through the collector 4 of transistor 1 increases, the potential at the collector 4 is applied through resistor 16 to the anode of asymmetric impedance 15. Under the cut off condition and all conditions of operation up to saturation the base 3 is at a potential with respect to the anode of impedance 15 that impedance 15 is then in its high impedance condition and is effectively cut off. As the current through the collector builds up, an equilibrium point will be reached between the potential at the base 3 and the potential at the collector 4; since the potential at the collector 4 is applied to the anode of impedance 15 at this point, impedance 15 changes to a low impedance condition. In this low impedance condition the positive potential of battery 13 is now applied to the base 3. This in effect reduces the magnitude of the negative potential at the base 3 and prevents a difference in potential between the base 3 and the collector 4. Reduction in magnitude of the potential at the base 3 reduces the base to collector amplification factor ($\alpha'$) of the transistor 1 so that saturation is prevented.

Figure 2:
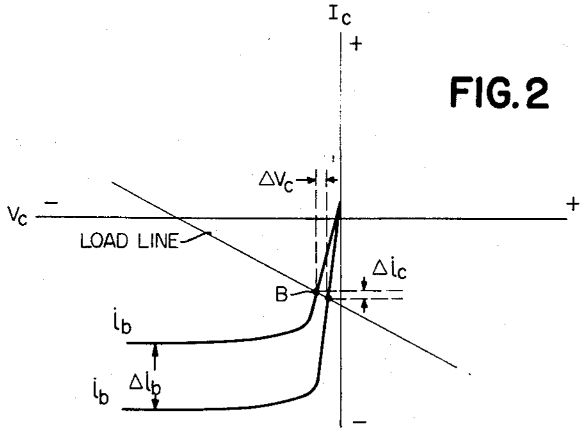
Figure 2 is a volt-ampere output characteristic of the transistor 1 of Figure 1.

It will be apparent that the choice of values of resistors 16 and 17 will govern the point in the output characteristic at which saturation will be prevented. Referring to Figure 2 a current-voltage output characteristic of transistor 1 in the embodiment illustrated in Figure 1 is shown wherein for the no signal condition, the current through transistor 1 is essentially zero departing therefrom by the value of the back current through the collector junction. A load line is shown, the slope of which is determined by the impedance in the collector circuit. When the transistor is conducting at voltage $V_c$ and current $I_c$, an increase of base current $\Delta i_b$ gives only a small increase of collector current $\Delta i_c$. Thus a larger fraction of carriers emitted must end up as base current because the increase of collector current is limited by collector current saturation. Through the use of the control circuit of this invention the feedback from collector to base prevents this $\Delta i_b$. Further, through the use of the control circuit of this invention a point B on the output characteristic can be selected, and the values of resistors 16 and 17 may be selected with respect to the other parameters in the circuit such that the reverse bias on asymmetric impedance 15 is overcome at this point. In other words the parameters in the circuit and the values of resistors 16 and 17 are so selected that the anode potential of asymmetric impedance 15 is slightly more positive then the potential of the base 3 when the current through the collector as described by the characteristic in Figure 2 reaches a selected point such as point B.

In order to aid in understanding and practicing this invention, the following set of figures and specifications are provided for the inverter circuit of Figure 1, it being understood that no limitations should be implied thereby, it being well established in the art that a wide range of parameters, transistor conductivities and performance characteristics are available for circuits of this type.

| | |
|---|---|
| Transistor 1 | Germanium PNP $\alpha > .972$. |
| Resistor 7 | 2.4K ohms. |
| Resistor 16 | .15K ohms. |
| Resistor 17 | 3.9K ohms. |
| Asymmetric impedance 15 | Back resistance 50K ohms, forward resistance 200 ohms, for example germanium diode, Sylvania type IN 34. |
| Diode 18 | Back resistance 50K ohms, forward resistance 200 ohms, for example germanium diode, Sylvania type IN 34. |
| Resistor 14 | 43K ohms. |
| Resistor 11 | 8.2K ohms. |
| Capacitor 12 | 390 micromicrofarads. |
| Battery 13 | 20 volts. |
| Battery 8 | 30 volts. |
| Battery 19 | 10 volts. |
| Input signal | 0 to −10 volts. |

What has been described is a transistor circuit having applied thereto a control principle wherein an asymmetric impedance is provided connected between a source of potential and the base of an active transistor element and a sensing means is provided for controlling the impedance of the asymmetric impedance in response to current flowing in the transistor.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the following claims.

What is claimed is:

1. A non-saturating transistor inverter circuit comprising in combination a transistor having emitter, base and collector connections having the emitter thereof connected to reference potential, a first potential source having one terminal thereof connected to reference potential, a first resistor having one terminal thereof connected to the collector of said transistor and having the remaining terminal connected to the remaining terminal of said first potential source, signal introduction means connected to the base of said transistor and operable to produce current flow therethrough, a second source of potential of opposite polarity to said first source having one terminal thereof connected to reference potential, a diode independent of said signal introduction means connected in the low impedance direction between the remaining terminal of said second source of potential and said base connection and current sensing means operable to apply potentials developed as a result of current flow at said collector connection to control the impedance of said diode.

2. A non-saturating transistor inverter circuit comprising a PNP type transistor having emitter, base and collector connections and having said emitter connection connected to reference potential, a first source of potential having the positive terminal thereof connected to reference potential, a first resistor having one terminal connected to said collector connection and having the remaining terminal connected to the negative terminal of said first potential source, an input terminal, a second resistor having one terminal connected to said input terminal and having the remaining terminal thereof connected to said base connection, a first capacitor having one terminal connected to said input terminal and having the remaining terminal thereof connected to said base connection, a second source of potential having the negative terminal thereof connected to reference potential, a third resistor having one terminal thereof connected to the positive terminal of said second potential source and having the remaining terminal thereof connected to said base connection, a diode having the cathode thereof connected to said base connection, a fourth resistor having one terminal thereof connected to the anode of said diode and having the remaining terminal thereof connected to said positive terminal of said second potential source, a fifth resistor having one terminal thereof connected to the anode of said diode and having the remaining terminal thereof connected to said collector connection and an output terminal connected to said collector connection.

3. A non-saturating transistor inverter circuit comprising a NPN type transistor having emitter, base and collector connections and having said emitter connection connected to reference potential, a first source of potential having the negative terminal thereof connected to reference potential, a first resistor having one terminal connected to said collector connection and having the remaining terminal connected to the positive terminal of said first potential source, an input terminal, a second resistor having one terminal connected to said input terminal and having the remaining terminal thereof connected to said base connection, a first capacitor having one terminal connected to said input terminal and having the remaining terminal thereof connected to said base connection, a second source of potential having the positive terminal thereof connected to reference potential, a third resistor having one terminal thereof connected to the negative terminal of said second potential source and having the remaining terminal thereof connected to said base connection, a diode having the anode thereof connected to said base connection, a fourth resistor having one terminal thereof connected to the cathode of said diode and having the remaining terminal thereof connected to said negative terminal of said second potential source, a fifth resistor having one terminal thereof connected to the cathode of said diode and having the remaining terminal thereof connected to said collector connection and an output terminal connected to said collector connection.

4. A transistor saturation control circuit comprising a transistor having at least emitter base and collector connection thereto, means establishing current flow in the emitter to collector current path of said transistor, a source of potential having a proper polarity when applied to the base connection of said transistor to oppose current flow through said transistor, a control diode, signal introduction means independent of said diode connected to the base of said transistor and operable to influence current flow therethrough, diode impedance control means including a source of potential connected through a voltage divider to a circuit point the potential of which is influenced by the collector current of said transistor, said control means including further means connecting said diode in the low impedance direction between a point in said voltage divider and the base of said transistor whereby the impedance of said diode is controlled in response to the magnitude of said current at said collector, and output signal sensing means responsive to current flow in said transistor.

References Cited in the file of this patent

UNITED STATES PATENTS

| | | |
|---|---|---|
| 2,737,587 | Trousdale | Mar. 6, 1956 |
| 2,787,712 | Priebe et al. | Apr. 2, 1957 |

OTHER REFERENCES

Linvill: "Nonsaturation Pulse Circuits Using Two Junction Transistors," Proceedings of the IRE, July 1955, pages 826–833.

Carlson: "High Speed Non Saturation Flip-Flops," Proceedings—Symposium on Application of Transistors to Military Electronics Equipment, Office of Sec. of Defense, September 1953, pages 299–321.